United States Patent
Kim et al.

(10) Patent No.: US 11,859,308 B2
(45) Date of Patent: Jan. 2, 2024

(54) SINGLE CRYSTAL TRANSITION METAL DICHALCOGENIDE THIN FILM AND METHOD FOR SYNTHESIZING THE SAME

(71) Applicant: Research & Business Foundation Sungkyunkwan University, Suwon-si (KR)

(72) Inventors: Ki Kang Kim, Suwon-si (KR); Soo Ho Choi, Suwon-si (KR)

(73) Assignee: Research & Business Foundation Sungkyunkwan University, Suwon-si (KR)

(*) Notice: Subject to any disclaimer, the term of this patent is extended or adjusted under 35 U.S.C. 154(b) by 590 days.

(21) Appl. No.: 17/153,029

(22) Filed: Jan. 20, 2021

(65) Prior Publication Data
US 2021/0222322 A1    Jul. 22, 2021

(30) Foreign Application Priority Data
Jan. 20, 2020  (KR) .................. 10-2020-0007060

(51) Int. Cl.
| | |
|---|---|
| C30B 25/18 | (2006.01) |
| H01L 21/02 | (2006.01) |
| C30B 29/46 | (2006.01) |
| C23C 16/30 | (2006.01) |

(52) U.S. Cl.
CPC .......... *C30B 25/186* (2013.01); *C23C 16/305* (2013.01); *C30B 29/46* (2013.01); *H01L 21/0262* (2013.01); *H01L 21/02425* (2013.01); *H01L 21/02568* (2013.01)

(58) Field of Classification Search
CPC ..... C30B 25/186; C30B 29/46; C23C 16/305; H01L 21/02425; H01L 21/02568; H01L 21/0262; H01L 21/02433
See application file for complete search history.

(56) References Cited

U.S. PATENT DOCUMENTS

| | | | | |
|---|---|---|---|---|
| 5,958,358 A | * | 9/1999 | Tenne | ..................... C30B 25/02 117/921 |
| 10,128,109 B2 | * | 11/2018 | Cannara | ............ H01L 21/02568 |
| 2014/0245946 A1 | * | 9/2014 | Kong | ..................... C23C 16/00 117/95 |
| 2015/0064471 A1 | * | 3/2015 | Dresselhaus | ............ C23C 14/12 428/408 |

* cited by examiner

*Primary Examiner* — David Sample
*Assistant Examiner* — Donald M Flores, Jr.
(74) *Attorney, Agent, or Firm* — NSIP Law

(57) ABSTRACT

Disclosed is a method for synthesizing a single crystal transition metal dichalcogenide thin film. The method includes processing a surface of a metal substrate such that a high index surface having a Miller index of (hkl) is exposed; and synthesizing a single crystal transition metal dichalcogenide on the high index surface using a chemical vapor deposition, wherein each of h, k, and l is independently an integer, and at least one of h, k, and l is an integer greater than or equal to +2 or smaller than or equal to −2.

5 Claims, 8 Drawing Sheets

[FIG. 1]
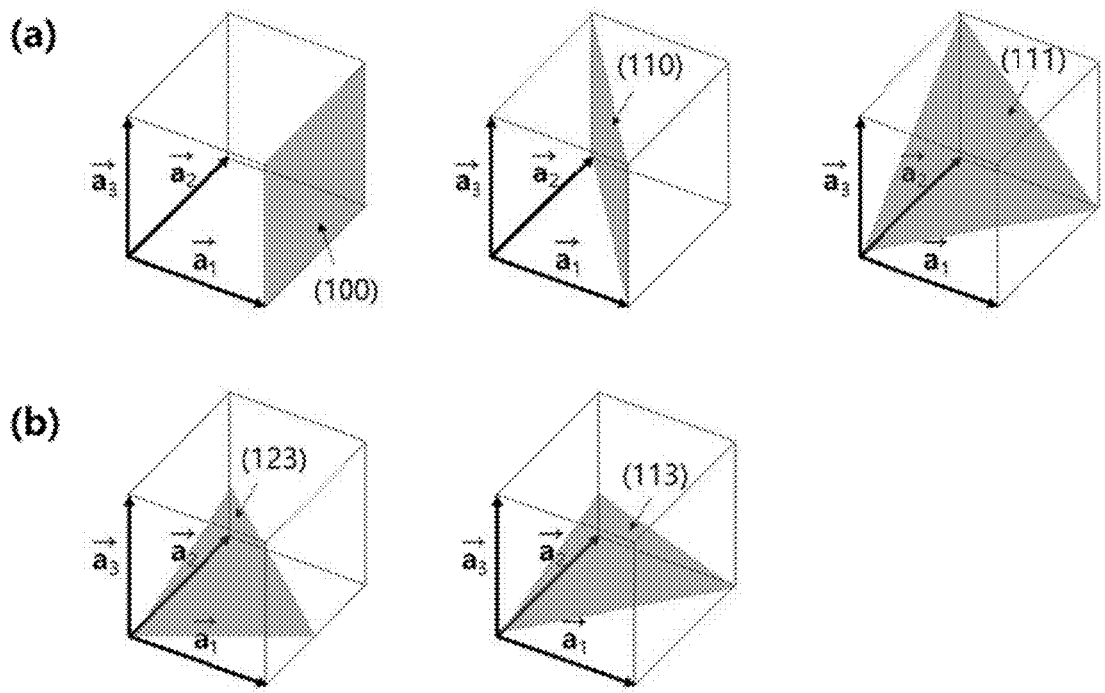

[FIG. 2]
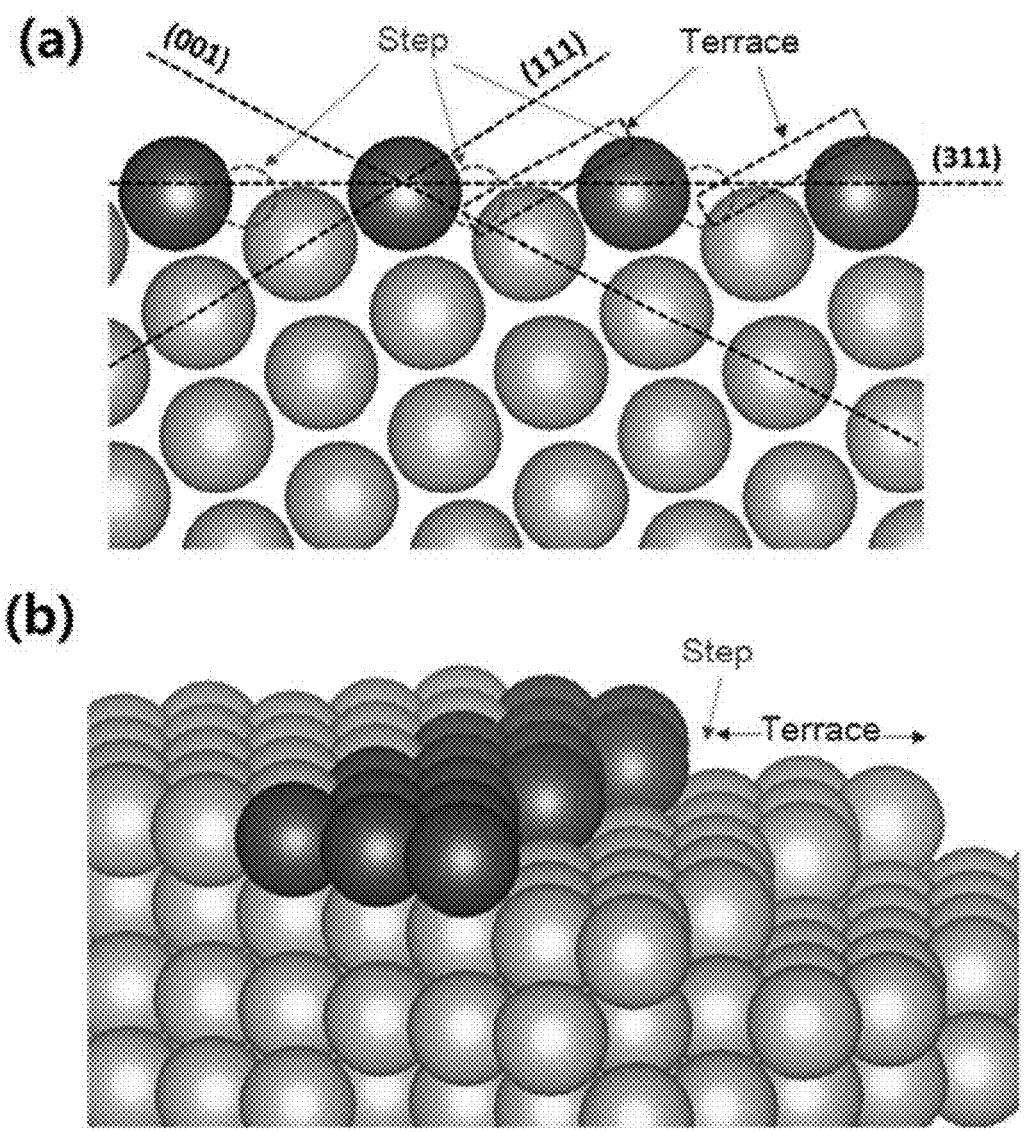

[FIG. 3]
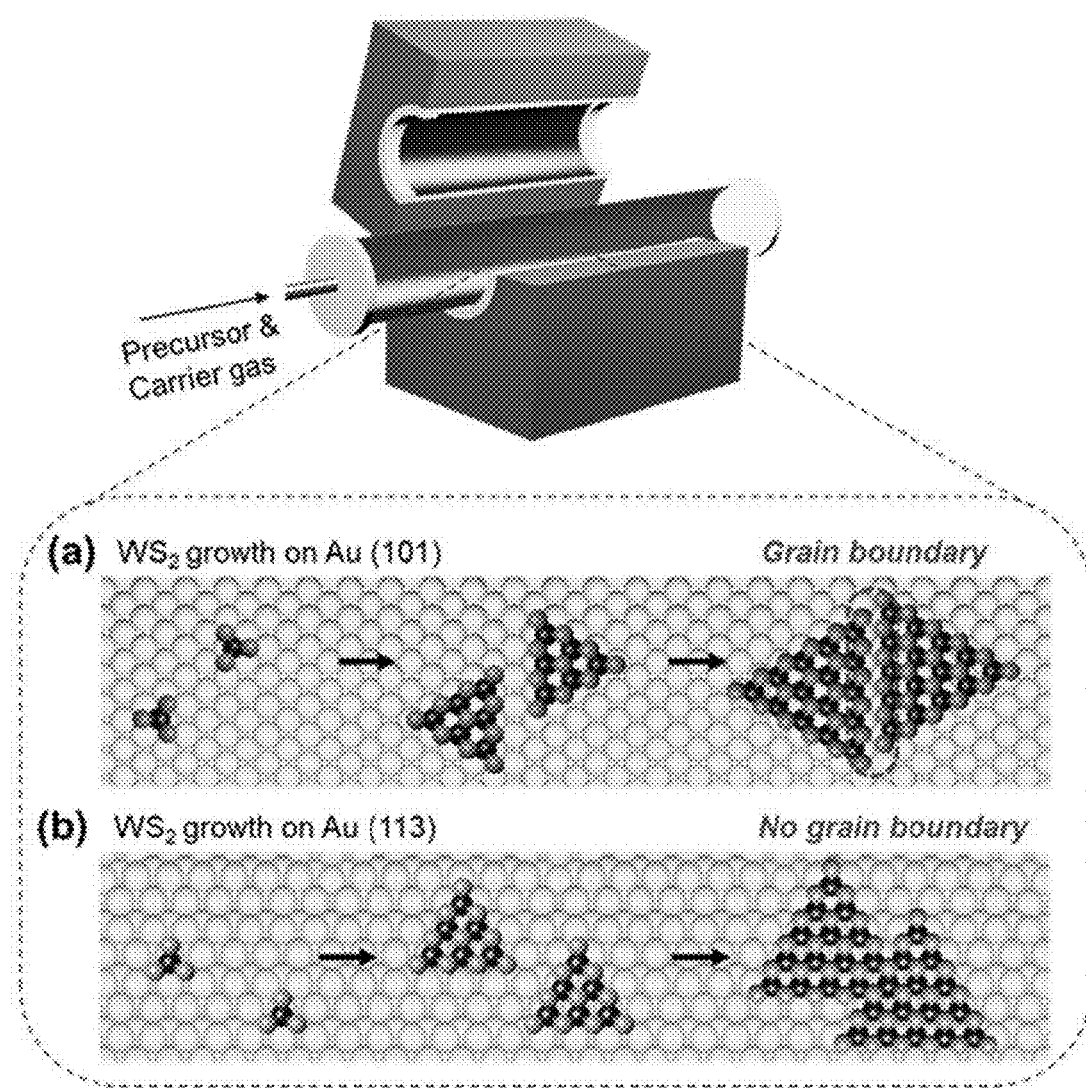

[FIG. 4]
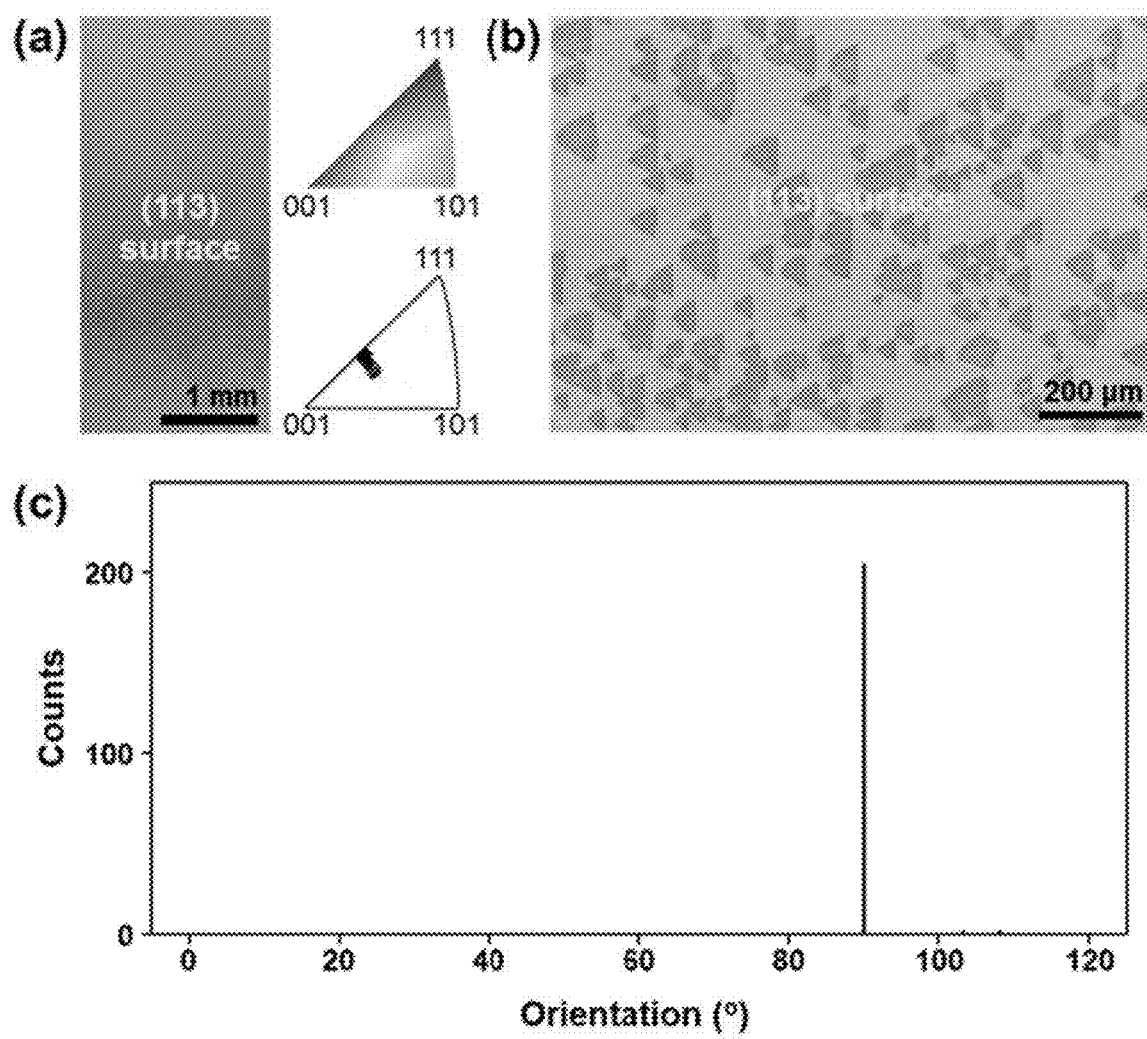

[FIG. 5]
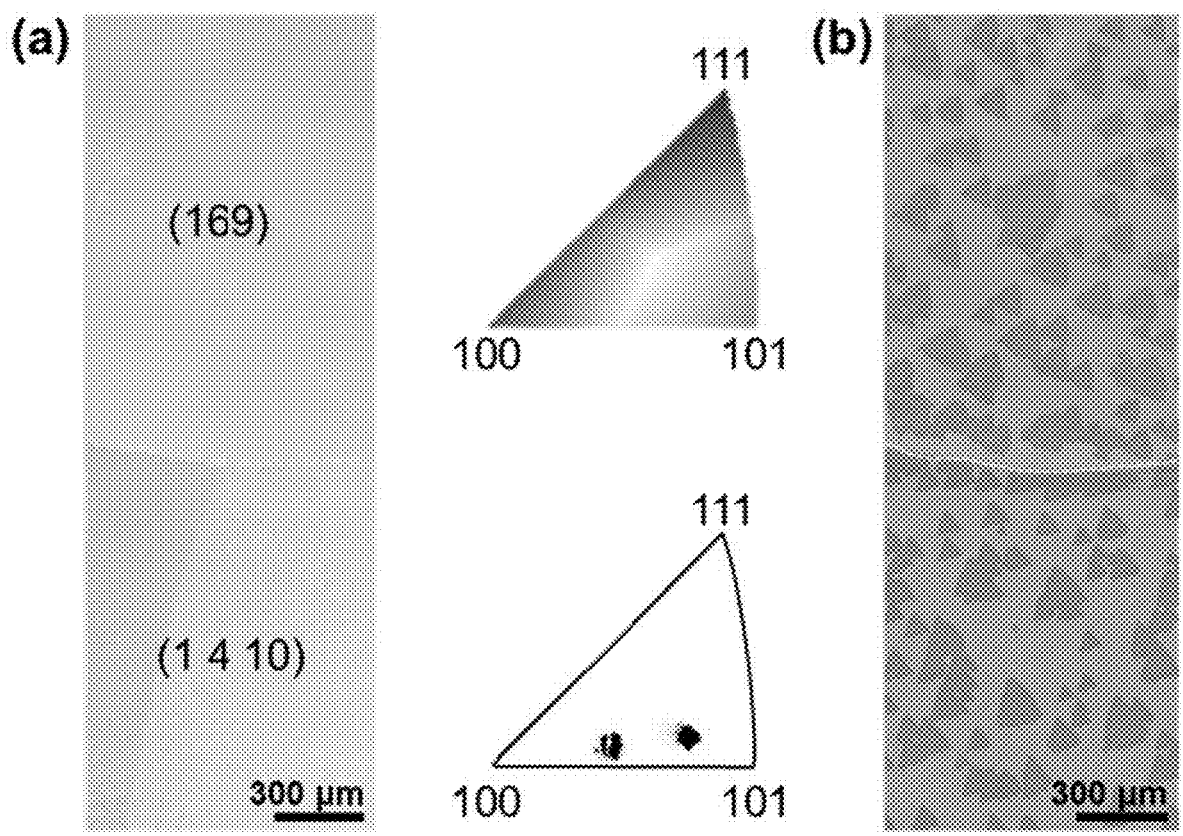

[FIG. 6]
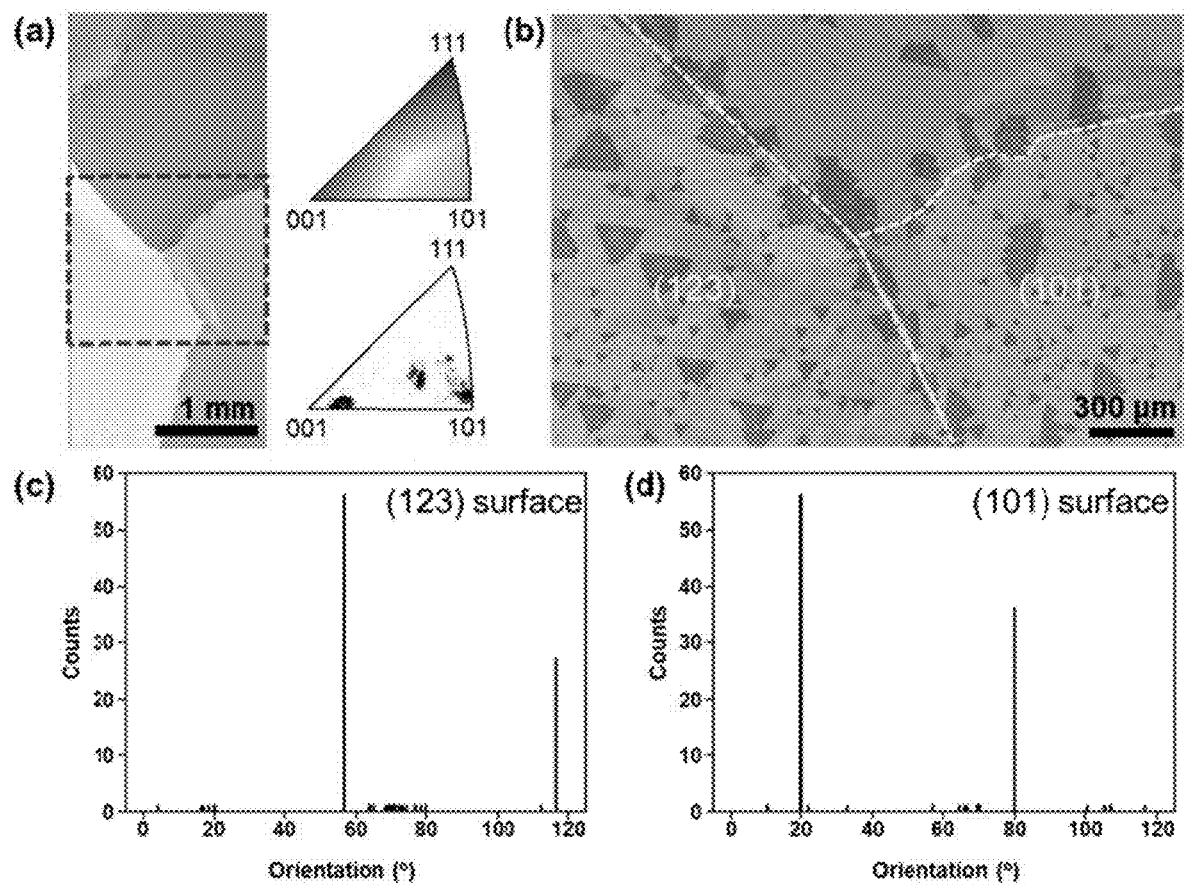

[FIG. 7]
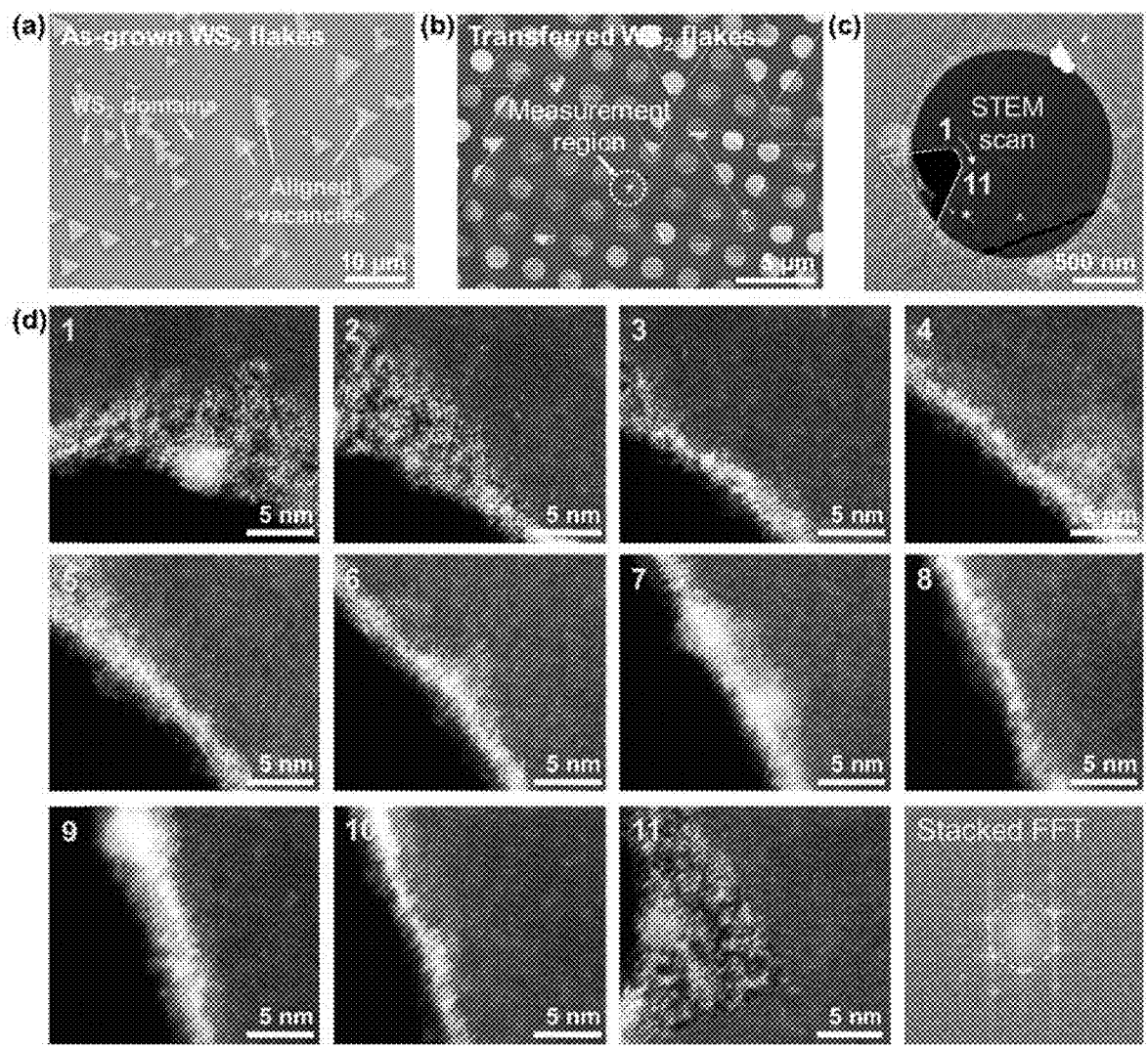

[FIG. 8]
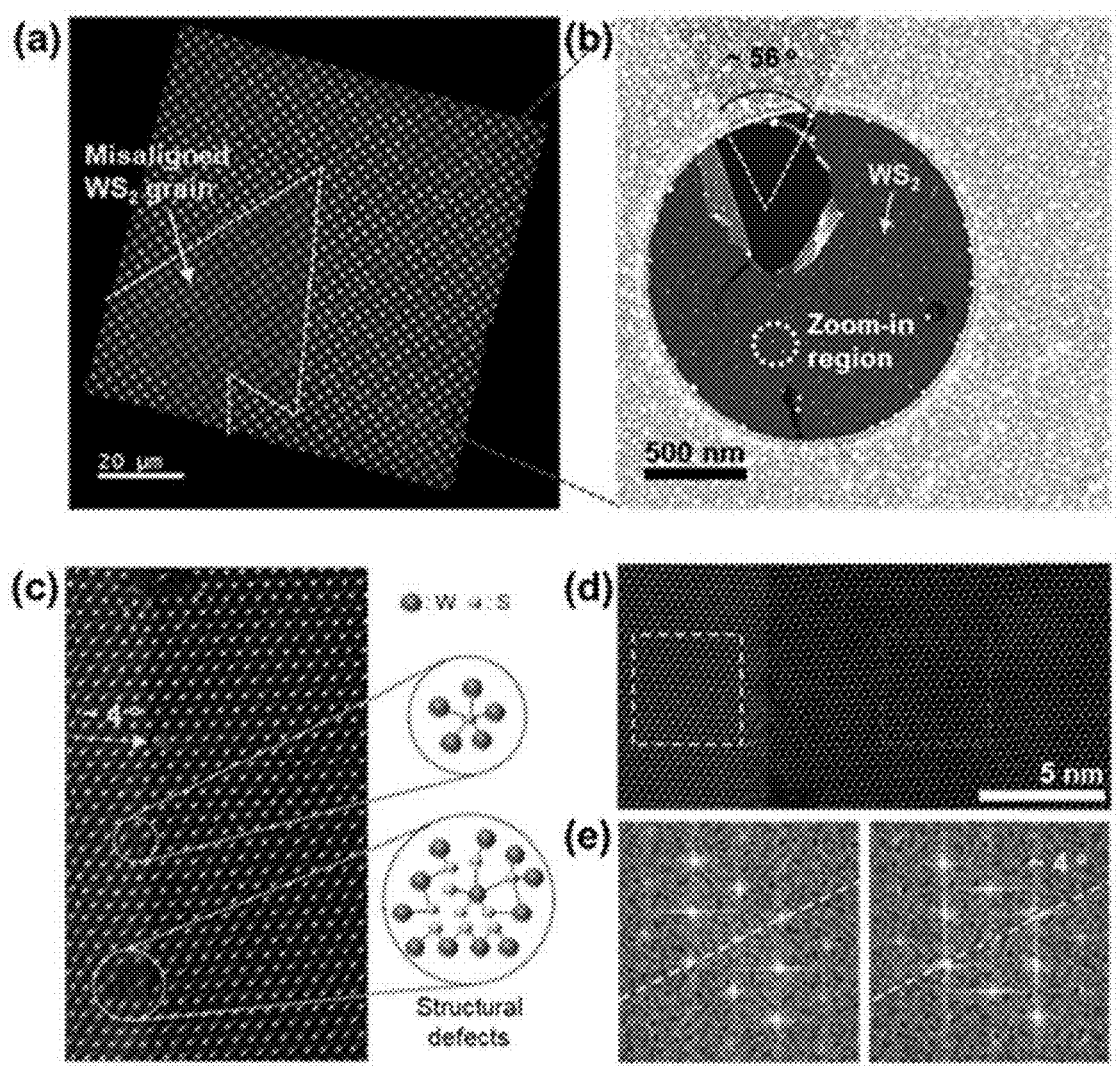

SINGLE CRYSTAL TRANSITION METAL DICHALCOGENIDE THIN FILM AND METHOD FOR SYNTHESIZING THE SAME

CROSS-REFERENCE TO RELATED APPLICATION

This application claims a benefit under 35 U.S.C. § 119(a) of Korean Patent Application No. 10-2020-0007060 filed on Jan. 20, 2020, on the Korean Intellectual Property Office, the entire disclosure of which is incorporated herein by reference for all purposes.

BACKGROUND

1. Field

The present disclosure relates to a single crystal transition metal dichalcogenide thin film having a large area and a method for synthesizing the same.

2. Description of Related Art

A transition metal dichalcogenide (TMD; MX 2) refers to a compound composed of a combination of a transition metal element (M=Mo, W) and a chalcogen element (X=S, Se). The transition metal dichalcogenide may have a direct band gap or an indirect band gap selectively based on various combinations of the transition metal element and the chalcogen element, and may be applied to a semiconductor field due to characteristics such as high mobility and excellent photo-reactivity.

To date, many studies using metal and insulator substrates to synthesize the transition metal dichalcogenide have been reported. When a synthesis method using an insulator substrate having a crystal structure surface of a hexagonal system and a (111) surface of FCC metal very similar to a crystal structure of the transition metal dichalcogenide is used, grains in a synthesized transition metal dichalcogenide have two crystallographic directions facing each other. Since grain boundaries are formed between the grains facing each other, a polycrystalline transition metal dichalcogenide thin film is finally synthesized. Further, even when a synthesis method using an amorphous insulator substrate (e.g., $SiO_2$/Si) is used, a polycrystalline transition metal dichalcogenide thin film is synthesized in which grains of the synthesized transition metal dichalcogenide have random crystallographic directions.

However, when the synthesized transition metal dichalcogenide thin film has the polycrystalline structure, a defect exists in the grain boundary to deteriorate inherent physical properties of the transition metal dichalcogenide material. Therefore, research on a substrate material (or a substrate surface) suitable for synthesis of a single crystal transition metal dichalcogenide thin film to secure the inherent properties of the TMD is required.

SUMMARY

This Summary is provided to introduce a selection of concepts in a simplified form that are further described below in the Detailed Description. This Summary is not intended to identify all key features or essential features of the claimed subject matter, nor is it intended to be used alone as an aid in determining the scope of the claimed subject matter.

One purpose of the present disclosure is to provide a method for synthesizing a single crystal transition metal dichalcogenide thin film free of grain boundaries having the same crystallographic direction, using a substrate having a high index surface.

Another purpose of the present disclosure is to provide a single crystal transition metal dichalcogenide thin film prepared using the method for synthesizing the single crystal transition metal dichalcogenide thin film.

Purposes of the present disclosure are not limited to the above-mentioned purpose. Other purposes and advantages of the present disclosure as not mentioned above may be understood from following descriptions and more clearly understood from embodiments of the present disclosure. Further, it will be readily appreciated that the purposes and advantages of the present disclosure may be realized by features and combinations thereof as disclosed in the claims.

One aspect of the present disclosure provides a method for synthesizing a single crystal transition metal dichalcogenide thin film, the method comprising: processing a surface of a metal substrate into a single crystal surface such that a high index surface having a Miller index of (hkl) is exposed; and synthesizing a single crystal transition metal dichalcogenide on the high index surface using a chemical vapor deposition, wherein each of h, k, and l is independently an integer, and at least one of h, k, and l is an integer greater than or equal to +2 or smaller than or equal to −2.

In one implementation of the method, the metal substrate is made of a metal or an alloy that does not react with a transition metal and chalcogen elements.

In one implementation of the method, the metal substrate is made of gold (Au) having an FCC (face-centered cubic) crystal structure.

In one implementation of the method, the transition metal dichalcogenide contains one transition metal element selected from a group consisting of molybdenum (Mo), tungsten (W) and chromium (Cr), and one chalcogen element selected from a group consisting of sulfur (S), selenium (Se), and tellurium (Te).

In one implementation of the method, the chemical vapor deposition is carried out in a temperature range of 500 to 900° C.

Another aspect of the present disclosure provides a single crystal transition metal dichalcogenide thin film prepared using the method as defined above.

In one implementation of the single crystal transition metal dichalcogenide thin film, a longitudinal length of the thin film is about 0.5 to 4 inches, and a transverse length of the thin film is about 0.5 to 4 inches.

Effects of the present disclosure may be as follows but may not be limited thereto.

According to the single crystal transition metal dichalcogenide thin film and the method for synthesizing the same according to the present disclosure, the single crystal transition metal dichalcogenide thin film may be prepared using the metal substrate having a high index plane, such that the grain boundary may not be formed in the synthesized thin film, and thus defects otherwise generated due to the grain boundary may be solved. In addition, a high-quality single crystal transition metal dichalcogenide thin film may be prepared and applied as a material for a next-generation electronic and optical devices.

In addition to the effects as described above, specific effects of the present disclosure will be described together with the detailed description for carrying out the disclosure.

BRIEF DESCRIPTION OF DRAWINGS

FIG. 1 is a diagram showing a crystallographic plane of a cubic crystal structure to describe a high index surface having a Miller index according to the present disclosure.

FIG. 2 is a diagram showing a high index plane of a face-centered cubic (FCC) crystal structure to describe a high index surface having a Miller index according to the present disclosure.

FIG. 3 is a diagram for describing a single crystal transition metal dichalcogenide thin film according to the present disclosure and a method for synthesizing the same according to the present disclosure.

FIG. 4 is a diagram showing a result of synthesis of tungsten disulfide ($WS_2$) as prepared according to Example 1 of the present disclosure.

FIG. 5 is a diagram showing a synthesis result of tungsten disulfide ($WS_2$) as prepared according to Example 2 of the present disclosure.

FIG. 6 is a diagram showing a synthesis result of tungsten disulfide ($WS_2$) as prepared according to Comparative Example 1 of the present disclosure.

FIG. 7 is a diagram showing an analysis result of grain boundaries of tungsten disulfide ($WS_2$) as prepared according to Example 1 of the present disclosure.

FIG. 8 is a diagram showing an analysis result of grain boundaries of tungsten disulfide ($WS_2$) as prepared according to Comparative Example 1 of the present disclosure.

DETAILED DESCRIPTIONS

For simplicity and clarity of illustration, elements in the figures are not necessarily drawn to scale. The same reference numbers in different figures denote the same or similar elements, and as such perform similar functionality. Moreover, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

Examples of various embodiments are illustrated and described further below. It will be understood that the description herein is not intended to limit the claims to the specific embodiments described. On the contrary, it is intended to cover alternatives, modifications, and equivalents as may be included within the spirit and scope of the present disclosure as defined by the appended claims.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

First, prior to describing the single crystal transition metal dichalcogenide thin film according to the present disclosure and the method for synthesizing the, a phrase "high index surface (high index plane)" used herein will be described in detail with reference to the drawings.

FIG. 1 is a diagram showing a crystallographic plane of a cubic crystal structure to describe a high index surface having a Miller index according to the present disclosure. (a) in FIG. 1 is a diagram for describing a low index plane, and shows crystallographic planes having (110), (110) and (111) low indices of a cubic crystal structure. (b) in FIG. 1 is a diagram for describing a high index plane, and shows high index planes having (123) and (113) Miller indexes of a cubic crystal structure.

Referring to FIG. 1, a crystallographic plane of the solid may be represented by the Miller index (Miller index, (khl)), where each of h, k and l may be an integer independently of each other. The low index plane may mean a crystallographic plane in which each of h, k, and l is independently an integer of −1 inclusive to +1 inclusive. For example, the low index plane may mean a crystallographic plane having a Miller index such as (001), (101), and (111). The high index plane may mean a crystallographic plane in which each of h, k, and l is independently an integer, and at least one of h, k, and l is an integer greater than or equal to +2 or smaller than or equal to −2. For example, the high index plane may mean a crystallographic plane having a Miller index such as (113) or (169).

FIG. 2 is a diagram showing a high index plane of a face-centered cubic (FCC) crystal structure to describe the high index surface having the Miller index according to the present disclosure. (a) in FIG. 2 shows a side view of a high index plane having a (113) Miller index of a FCC crystal structure. (b) in FIG. 2 shows a schematic diagram of a high index plane having a (169) Miller index of a FCC crystal structure. Both the (113) and (169) crystallographic planes have steps and terraces.

Referring to FIG. 2, the high index plane having a (113) Miller index may be formed by a combination of low index planes having (001) and (111) Miller indexes, respectively. In this connection, the two low index planes meet with each other to form a step and a terrace. The step may be formed at a point where the two low index planes meet with each other. A periodicity of the steps may be determined based on the terrace. Therefore, as a difference between h, k and l constituting the Miller index increases, a slope of the step may increase, and a width of the terrace may decrease. The high index surface as used herein may mean a crystallographic plane in which the width of the terrace corresponds to a size of 2 or more atoms.

FIG. 3 is a diagram for describing a single crystal transition metal dichalcogenide thin film according to the present disclosure and a method for synthesizing the same according the present disclosure.

Referring to FIG. 3, a method for synthesizing a single crystal transition metal dichalcogenide thin film according to the present disclosure includes processing a metal substrate such that a high index surface thereof having a Miller index of (hkl) is exposed; and synthesizing a single crystal transition metal dichalcogenide on the high index surface using a chemical vapor deposition, wherein each of h, k, and l is independently an integer, and at least one of h, k, and l is an integer greater than or equal to +2 or smaller than or equal to −2.

In treating the single crystal metal substrate, the metal substrate may include a metal that does not react with a transition metal and chalcogen elements, for example, one selected from gold (Au), nickel-gallium alloy (Ni—Ga alloy), etc. Preferably, the metal substrate may be made of gold (Au) having an FCC crystal structure.

In one embodiment, the single crystal metal substrate may be prepared by performing heat treatment at a temperature close to a melting point of the metal substrate.

In synthesizing the single crystal transition metal dichalcogenide, the chemical vapor deposition may be performed using a chemical vapor deposition apparatus.

As shown in FIG. 3, the chemical vapor deposition apparatus may include a deposition chamber, precursor supply means and carrier gas supply means. The metal substrate may be disposed in the deposition chamber. The precursor supply means and the carrier gas supply means may supply the precursor and the carrier gas to the deposition chamber. The carrier gas may act as moving precursor molecules onto the metal surface, and may include one selected from nitrogen ($N_2$) and argon (Ar).

In the chemical vapor deposition, when the precursor and the carrier gas are injected into the chamber through the precursor supply means and the carrier gas supply means in a state in which the metal substrate is disposed in the chamber, the carrier gas may move the precursor molecules onto the metal substrate surface to cause a chemical reaction therebetween, so that a single crystal transition metal dichalcogenide thin film may be formed on the metal substrate.

In one embodiment, the chemical vapor deposition may be performed at a high temperature for the chemical reaction of the precursor molecules. For example, the chemical vapor deposition may be performed in a temperature range of 500 to 900° C.

The transition metal dichalcogenide may contain one transition metal element selected from molybdenum (Mo), tungsten (W) and chromium (Cr), and one chalcogen element selected from sulfur (S), selenium (Se), and tellurium (Te). For example, the transition metal dichalcogenide may be tungsten disulfide ($WS_2$).

The transition metal dichalcogenide thin film as prepared according to the present disclosure may have a single crystal structure having a constant crystallographic direction and free of grain boundaries. The transition metal dichalcogenide thin film may have a large area size which may be about 0.5 to 4 inches in a longitudinal length, and about 0.5 to 4 inches in a transverse length.

According to the single crystal transition metal dichalcogenide thin film according to the present disclosure and the method for synthesizing the same according to the present disclosure, the metal having the high index surface may be used as the substrate to prepare the single crystal transition metal dichalcogenide thin film which may have significantly improved durability, compared to that of a conventional transition metal dichalcogenide thin film as prepared using the metal and insulator substrates. Further, the large area single crystal transition metal dichalcogenide thin film may be prepared.

Hereinafter, an Example and a Comparative Example of the present disclosure will be described in detail. However, following Examples are only some embodiments of the present disclosure, and a scope of the present disclosure is not limited to the following Examples.

Example 1

Tungsten disulfide ($WS_2$) was synthesized on the metal substrate made of gold using a chemical vapor deposition method, wherein a high index surface thereof having a (113) Miller index was exposed.

Example 2

Tungsten disulfide ($WS_2$) was synthesized on the metal substrate made of gold using a chemical vapor deposition method, wherein a high index surface thereof having (169) and (1410) Miller indexes was exposed.

Comparative Example 1

Tungsten disulfide ($WS_2$) was synthesized on a metal substrate made of gold using a chemical vapor deposition method, wherein the metal substrate was a polycrystalline metal substrate having a crystallographic plane having (123) and (101) Miller indexes.

Experimental Example 1: Analysis of Result of Synthesis of Transition Metal Dichalcogenide FIG. 4 is a diagram showing a result of synthesis of tungsten disulfide ($WS_2$) as prepared according to Example 1 of the present disclosure. (a) in FIG. 4 is a diagram showing a result of EBSD measurement in which a crystallographic direction of the gold (Au) substrate surface is expressed based on a color. (b) in FIG. 4 is an SEM image of tungsten disulfide ($WS_2$) grains as prepared according to Example 1. (c) in FIG. 4 is a diagram showing a crystallographic direction statistical graph of tungsten disulfide ($WS_2$) grains as prepared according to Example 1.

Referring to FIG. 4, (a) it may be identified that in the diagram showing the result of electron backscatter diffraction (EBSD) in which the crystallographic direction of the metal substrate is expressed in color, all directions are expressed in pink. Thus, it may be identified that the metal substrate has a (113) high index plane. (b) based on the SEM image of the $WS_2$ grains as synthesized on the substrate, it may be identified that all of triangular-shaped $WS_2$ grains are oriented in the same direction. (c) it may be seen that the crystallographic directions of at least 500 $WS_2$ grains as synthesized on the (113) surface are aligned in substantially the same direction (inclined by about 15° relative to a horizontal line). Based on this analysis, it may be identified that the transition metal dichalcogenide thin film based on single crystals aligned in the same direction may be synthesized using the method for synthesizing the thin film according to the present disclosure.

FIG. 5 is a diagram showing the synthesis result of tungsten disulfide ($WS_2$) as prepared according to Example 2 of the present disclosure. (a) in FIG. 5 is a diagram showing the result of EBSD measurement in which the crystallographic direction of the gold (Au) substrate surface is expressed in color. (b) in FIG. 5 is an SEM image of tungsten disulfide ($WS_2$) grains as prepared according to Example 2.

Referring to FIG. 5, (a) in the diagram showing the result of electron backscatter diffraction (EBSD) in which the crystallographic direction of the metal substrate is expressed in color, it may be identified that crystallographic directions are expressed in yellow green and orange colors, which express (169) and (1410) crystallographic planes, respectively. Thus, it may be identified that the metal substrate has a high index plane. (b) based on the SEM image of the $WS_2$ grains as synthesized on the substrate, it may be identified that most of the triangular $WS_2$ grains are aligned in one direction.

FIG. 6 is a diagram showing a synthesis result of tungsten disulfide ($WS_2$) prepared according to Comparative Example 1 of the present disclosure. (a) in FIG. 6 is a diagram showing the result of EBSD measurement in which the crystallographic direction of the gold (Au) substrate surface is expressed in color. (b) in FIG. 6 is an SEM image of tungsten disulfide ($WS_2$) grains prepared according to Comparative Example 1. (c) and (d) in FIG. 6 are diagrams showing crystallographic direction statistical graphs of tungsten disulfide ($WS_2$) grains as prepared according to Comparative Example 1.

Referring to FIG. 6, (a) in the diagram showing the result of electron backscattering diffraction (EBSD) in which the crystallographic direction of the metal substrate is expressed in color, it may be seen that the crystallographic directions are expressed in two colors, that is, light green and dark green. Light green represents a (123) crystallographic plane, and dark green represents a (101) crystallographic plane. Thus, it may be seen that the metal substrate of Comparative Example 1 has crystallographic planes having (123) and (101) Miller indexes. Further, (b) based on the SEM images of the $WS_2$ grains as synthesized on the substrate, it may be identified that the triangular shaped $WS_2$ grains oriented in opposite directions were synthesized on the surfaces of (123) and (101) grains. In (c), it may be identified that the crystallographic directions of the $WS_2$ grains synthesized on the (123) and (101) surfaces were distributed in two directions having a difference of about 60° therebetween. Thus, it may be identified that when preparing a thin film made of the transition metal dichalcogenide using a polycrystalline metal substrate, a polycrystalline transition metal dichalcogenide may be synthesized.

Experimental Example 2: Analysis of Transition Metal Dichalcogenide Grain Boundary FIG. 7 is a diagram showing a result of grain boundary analysis of tungsten disulfide ($WS_2$) prepared according to Example 1 of the present disclosure. (a) in FIG. 7 is a diagram showing a SEM image of tungsten disulfide ($WS_2$) prepared according to Example 1. (b) and (c) in FIG. 7 are TEM images of tungsten disulfide ($WS_2$) prepared according to Example 1. (d) in FIG. 7 show STEM images measured at various 11 positions on the grain boundaries and a single overlapping image of 11 Fast Fourier Transformation (FFT) patterns as extracted from 11 regions, respectively.

Referring to FIG. 7, (a) based on the SEM image of $WS_2$ grains grown on a high index (113) gold surface, it may be seen that all of the triangular-shaped $WS_2$ grains are aligned in the same direction (where a dark color represents $WS_2$, and a bright color represents the gold surface). In (b) to (d), it may be identified that the atoms in each grain are arranged in the same direction. It may be seen that no atomic defects are observed in an area where the grain boundary is expected to be formed. Thus, it may be seen that grain boundaries are not formed between grains having the same crystal orientation.

FIG. 8 is a diagram showing a result of grain boundary analysis of tungsten disulfide ($WS_2$) prepared according to Comparative Example 1 of the present disclosure. (a) and (b) in FIG. 8 are diagrams respectively showing low magnification based and enlarged TEM images measured at the grain boundary between tungsten disulfide ($WS_2$) grains. (c) and (d) in FIG. 8 are diagrams showing STEM images measured while a white dotted circle area shown in (b) in FIG. 8 is expanded. (e) in FIG. 8 is a diagram showing a Fast Fourier Transformation (FFT) image extracted from each of yellow and red dotted box regions in (d) in FIG. 8.

Referring to FIG. 8, in (a) and (b), based on the SEM image, it may be identified that $WS_2$ grains whose crystal orientations are not identical with each other. It may be identified that in (c) and (d) in which a zoom-in region indicated by the white dotted line in (b) is enlarged, two grains, that is, a grain as expressed in yellow and a grain expressed in red are present. With reference to (e), it may be seen that the orientations of tungsten atoms in the two grains differs from each other by about 4°. Thus, it may be seen that when the arrangement directions of the atoms are different from each other, a space where atoms are empty, that is, structure defects are formed in the grain boundary.

In the above descriptions, the present disclosure has been described with reference to the preferred embodiments. However, those skilled in the relevant technical field variously modify the present disclosure without departing from the spirit and scope of the present disclosure described in the following claims.

What is claimed is:

1. A method for synthesizing a single crystal transition metal dichalcogenide thin film, the method comprising:
   processing a surface of a metal substrate such that a high index surface having a Miller index of (hkl) is exposed; and
   synthesizing a single crystal transition metal dichalcogenide on the high index surface using a chemical vapor deposition,
   wherein each of h, k, and l is independently an integer, and at least one of h, k, and l is an integer greater than or equal to +2 or smaller than or equal to −2.

2. The method of claim 1, wherein the metal substrate is made of a metal or an alloy that does not react with a transition metal and chalcogen elements.

3. The method of claim 2, wherein the metal substrate is made of gold (Au) having an FCC (face-centered cubic) crystal structure.

4. The method of claim 1, wherein the transition metal dichalcogenide contains one transition metal element selected from a group consisting of molybdenum (Mo), tungsten (W) and chromium (Cr), and one chalcogen element selected from a group consisting of sulfur (S), selenium (Se), and tellurium (Te).

5. The method of claim 1, wherein the chemical vapor deposition is carried out in a temperature range of 500 to 900° C.

* * * * *